(12) United States Patent
Elmegreen et al.

(10) Patent No.: US 9,466,781 B2
(45) Date of Patent: Oct. 11, 2016

(54) LOW VOLTAGE TRANSISTOR AND LOGIC DEVICES WITH MULTIPLE, STACKED PIEZOELECTRONIC LAYERS

(71) Applicant: International Business Machines Corporation, Armonk, NY (US)

(72) Inventors: Bruce G. Elmegreen, Golden's Bridge, NY (US); Glenn J. Martyna, Croton on Hudson, NY (US); Dennis M. Newns, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/131,484

(22) Filed: Apr. 18, 2016

(65) Prior Publication Data

US 2016/0218274 A1 Jul. 28, 2016

Related U.S. Application Data

(63) Continuation of application No. 14/468,822, filed on Aug. 26, 2014.

(51) Int. Cl.
| | |
|---|---|
| *H01L 29/84* | (2006.01) |
| *H01L 41/107* | (2006.01) |
| *H01L 41/083* | (2006.01) |
| *H01L 41/047* | (2006.01) |
| *H01L 41/187* | (2006.01) |

(52) U.S. Cl.
CPC .......... *H01L 41/107* (2013.01); *H01L 41/0472* (2013.01); *H01L 41/083* (2013.01); *H01L 41/1876* (2013.01)

(58) Field of Classification Search
CPC .......... H01L 2224/75347; H01L 2224/79347; H01L 41/00; H01L 51/00; H01L 41/044; H01L 41/083; H01L 41/183; H01L 41/047; H01L 41/08; H01L 41/04
USPC ...................... 257/415; 438/24, 50; 310/311
See application file for complete search history.

(56) References Cited

U.S. PATENT DOCUMENTS

| | | | |
|---|---|---|---|
| 8,405,279 B2 * | 3/2013 | Elmegreen .............. | H01L 49/00 310/318 |
| 2010/0328984 A1 | 12/2010 | Elmegreen et al. | |
| 2013/0009668 A1 | 1/2013 | Elmegreen et al. | |
| 2014/0169078 A1 | 6/2014 | Elmegreen et al. | |

* cited by examiner

*Primary Examiner* — Jarrett Stark
*Assistant Examiner* — Shahed Ahmed
(74) *Attorney, Agent, or Firm* — Cantor Colburn LLP; Vazken Alexanian

(57) ABSTRACT

A piezoelectronic transistor device includes a first piezoelectric (PE) layer, a second PE layer, and a piezoresistive (PR) layer arranged in a stacked configuration, wherein an electrical resistance of the PR layer is dependent upon an applied voltage across the first and second PE layers by an applied pressure to the PR layer by the first and second PE layers. A piezoelectronic logic device includes a first and second piezoelectric transistor (PET), wherein the first and second PE layers of the first PET have a smaller cross sectional area than those of the second PET, such that a voltage drop across the PE layers of the first PET creates a first pressure in the PR layer of the first PET that is smaller than a second pressure in the PR layer of the second PET created by the same voltage drop across the PE layers of the second PET.

1 Claim, 9 Drawing Sheets

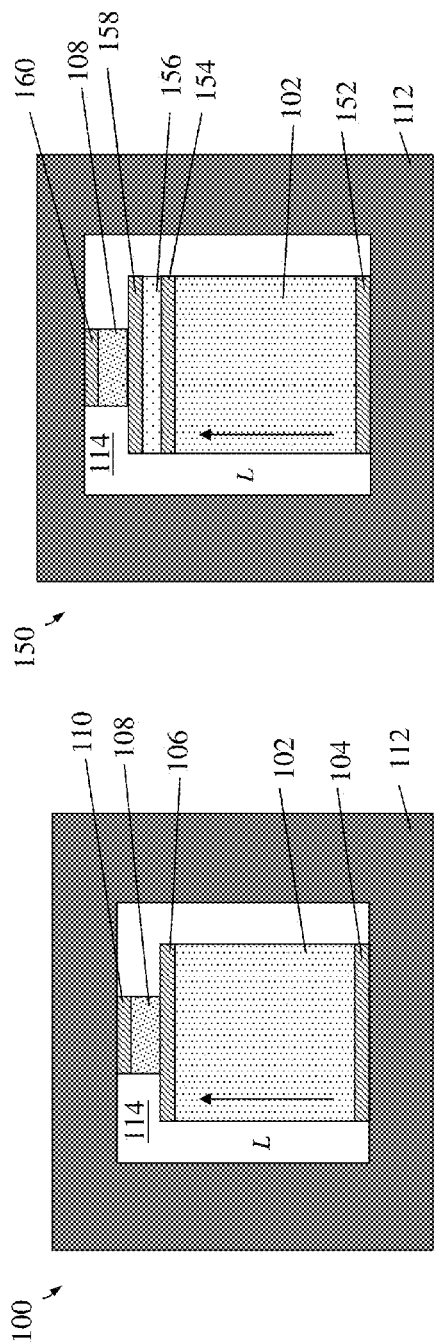
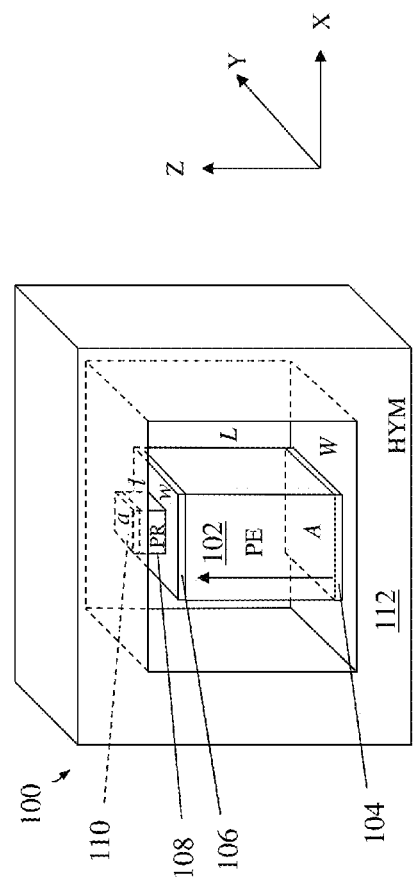
Figure 1A
Figure 1B
Figure 1C

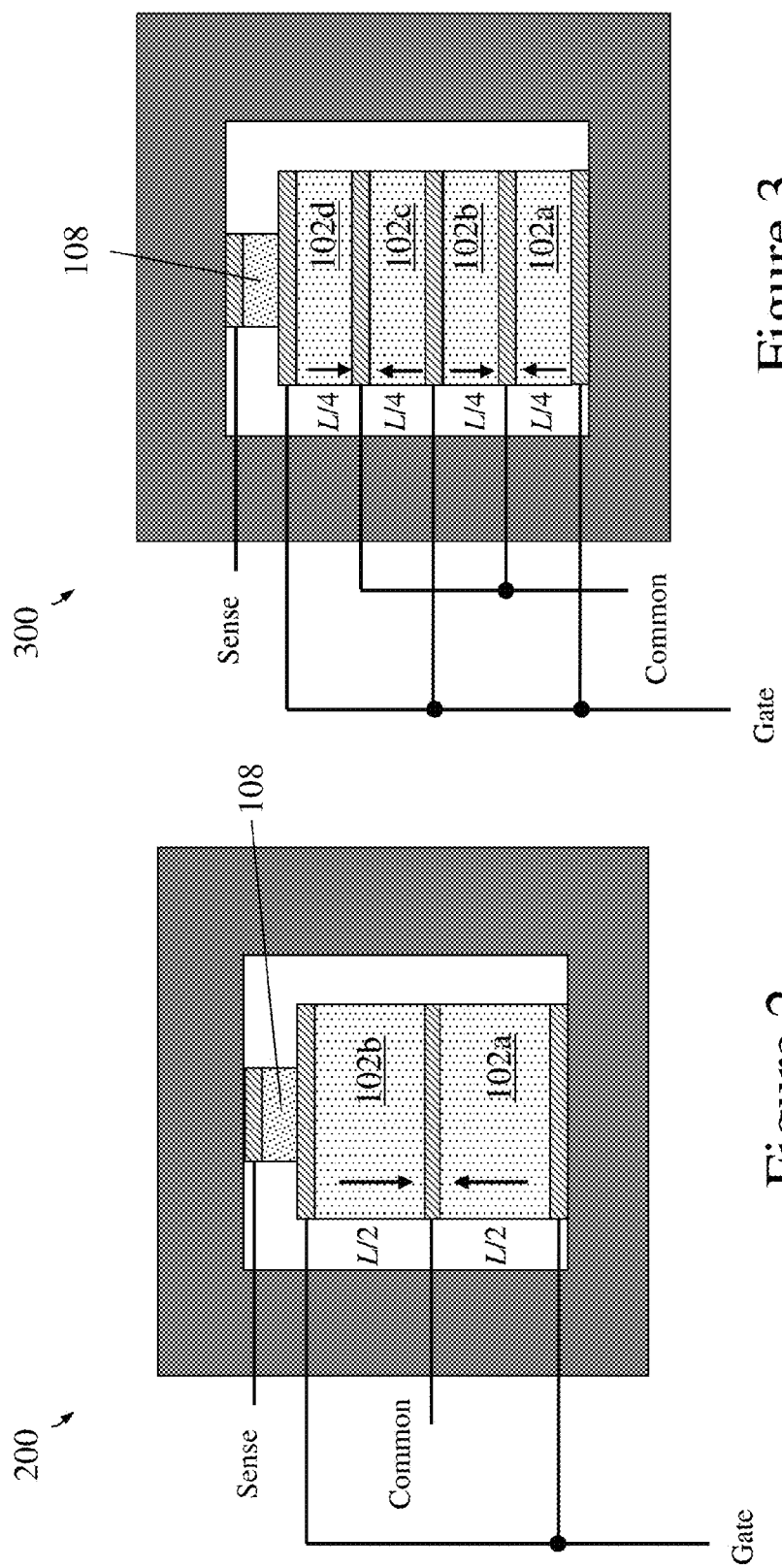

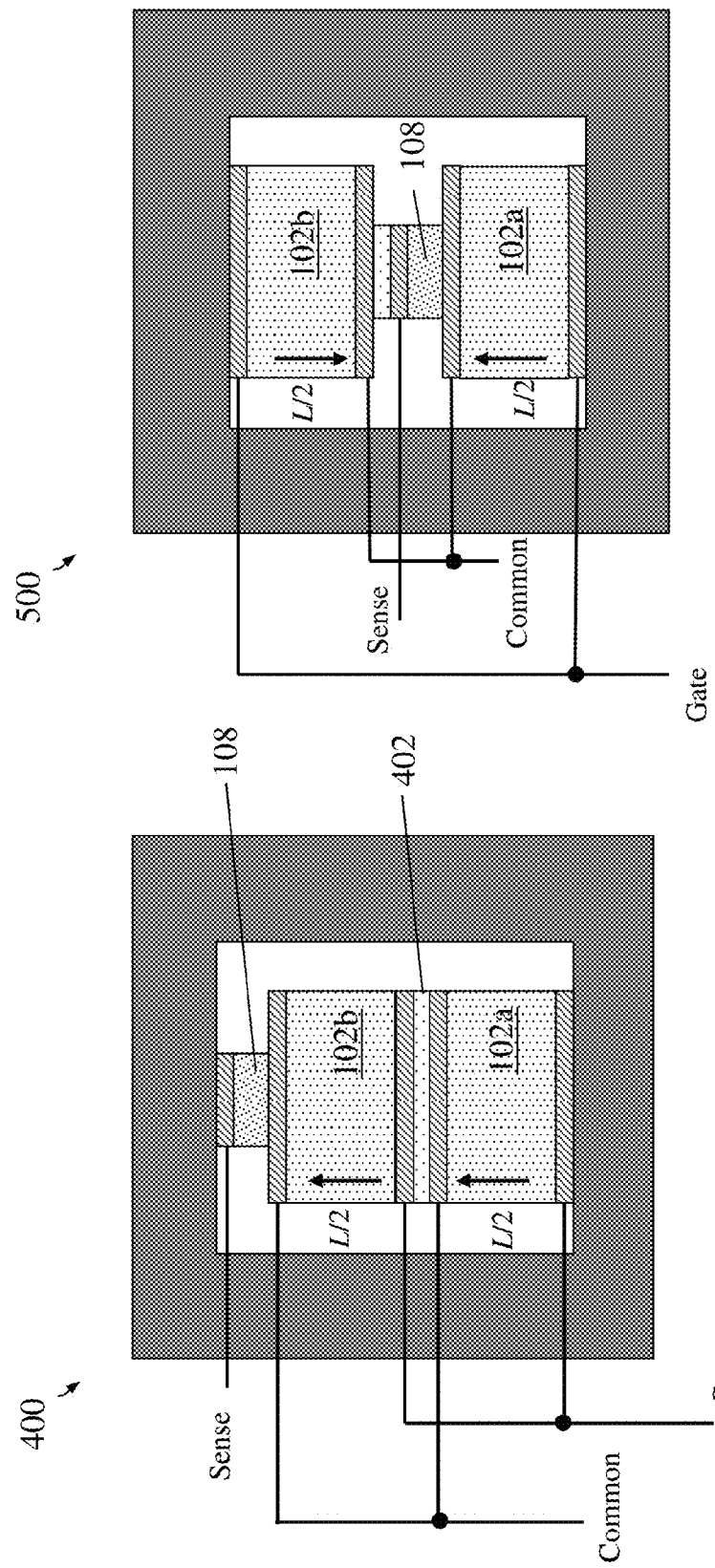

| Design | PE height | $V/V_0$ | $C/C_0$ | $R/R_0$ | $f/f_0$ |
|---|---|---|---|---|---|
| Fig 2: 2 PEs, PR at end | L/2 | 1/2 | 4 | 1/4 | 1 |
| Fig 3: N PEs, PR at end | L/N | 1/N | $N^2$ | $1/N^2$ | 1 |
| Fig 5: 2 PEs, PR in middle | L/2 | 1/2 | 4 | 1/8 | 2 |
| Fig 6: N PEs, N/2 PRs in middle | L/N | 1/N | $N^2$ | $1/N^3$ | N |

Figure 7

| IP1 | IP2 | PE 102a | PE 102b | R 108a | PE 102c | PE 102d | R 108b | OP=1&2 |
|---|---|---|---|---|---|---|---|---|
| 0 | 0 | - | - | Hi | E | E | Lo | 0 |
| 0 | 1 | - | E | Hi | E | - | Lo | 0 |
| 1 | 0 | E | - | Hi | - | E | Lo | 0 |
| 1 | 1 | E | E | Lo | - | - | Hi | 1 |

| IP1 | IP2 | PE 102a | PE 102b | R 108a | PE 102c | PE 102d | R 108b | OP=1&2 |
|---|---|---|---|---|---|---|---|---|
| 0 | 0 | - | - | Hi | E | E | Lo | 1 |
| 0 | 1 | - | E | Hi | E | - | Lo | 1 |
| 1 | 0 | E | - | Hi | - | E | Lo | 1 |
| 1 | 1 | E | E | Lo | - | - | Hi | 0 |

LOW VOLTAGE TRANSISTOR AND LOGIC DEVICES WITH MULTIPLE, STACKED PIEZOELECTRONIC LAYERS

DOMESTIC BENEFIT/NATIONAL STAGE INFORMATION

This application is a continuation of U.S. application Ser. No. 14/468,822 filed Aug. 26, 2014, the disclosure of which is incorporated by reference herein in its entirety.

STATEMENT OF GOVERNMENT INTEREST

This invention was made with Government support under Contract No.: N66001-11-C-4109 awarded by Defense Advanced Research Projects Agency (DARPA). The Government has certain rights in this invention.

BACKGROUND

The present invention relates generally to integrated circuit devices and, more particularly, to low voltage transistor and logic devices with multiple, stacked piezoelectronic layers.

Field Effect Transistors (FETs) support the standard computer architecture (CMOS) currently used in logic and memory. Their shrinking size over several decades, following Moore's law, led to enormous increases in speed and reductions in voltage, as predicted by Dennard scaling theory. However, starting around 2003, supply voltages could no longer be reduced, and that meant clock speeds had to be limited to prevent excessive power densities. Discovery of a fast, low voltage switching device, based on a different principle of operation, has become critical for the continued pace of information technology.

One way in which the approach could be different would be to have the voltage that controls the switching device transduced into another energy state, such as pressure, which is gated and then transduced back into a voltage or current at the output. With mechanical amplification in the case of pressure transduction, it is possible to have a very small input voltage control a rather large output. The result is a switch for logic and memory that operates at an extremely low power density.

It is also desirable to find a technology that can build multi-layer structures that open up significant new applications, such as high capacity multilayer memories and combinations of logic and memory at different levels optimized to reduce wiring length. Such structures are very difficult to make in CMOS because of the need for all FETs to be formed in single crystal silicon. Technologies based on other materials may allow more three-dimensional structures.

SUMMARY

In an exemplary embodiment, a piezoelectronic transistor device includes a first piezoelectric (PE) material layer, a second PE material layer, and a piezoresistive (PR) material layer arranged in a stacked configuration, wherein an electrical resistance of the PR material layer is dependent upon an applied voltage across the first and second PE material layers by way of an applied pressure to the PR material layer by the first and second PE material layers.

In another embodiment, a piezoelectronic logic device includes a first piezoelectric transistor (PET) device and a second PET device, the first PET device and the second PET device each having a first PE material layer, a second PE material layer, and a piezoresistive (PR) material layer arranged in a stacked configuration, wherein an electrical resistance of the PR material layer is dependent upon an applied voltage across the first and second PE material layers by way of an applied pressure to the PR material layer by the first and second PE material layers; wherein the first and second PE material layers of the first PET device have a smaller cross sectional area than the first and second PE material layers of the second PET device such that a voltage drop across the first and second PE material layers of the first PET device creates a first pressure in the PR material layer of the first PET device that is smaller with respect to a second pressure in the PR material layer of the second PET device created by the same voltage drop across the first and second PE material layers of the second PET device.

BRIEF DESCRIPTION OF THE SEVERAL VIEWS OF THE DRAWINGS

Referring to the exemplary drawings wherein like elements are numbered alike in the several Figures:

FIG. 1A is a schematic cross-sectional diagram of a 3-terminal piezoelectronic transistor (PET) device having a single piezoelectric (PE) material layer coupled to a piezoresistive (PR) material layer;

FIG. 1B is a perspective view of the 3-terminal PET device of FIG. 1A;

FIG. 1C is a schematic cross-sectional diagram of a 4-terminal PET device having a single PE layer coupled to a PR material layer;

FIG. 2 is a schematic cross-sectional diagram of a 3-terminal PET device having first and second PE material layers coupled to a PR material layer, in which the first and second PE material layers have thicknesses about half that of the PE material layer of FIGS. 1A-1C, in accordance with an exemplary embodiment;

FIG. 3 is a schematic cross-sectional diagram of a 3-terminal PET device having first, second, third and fourth PE material layers coupled to a PR material layer, in which the first through fourth PE material layers have thicknesses about one quarter of that of the PE material layer of FIGS. 1A-1C, in accordance with another exemplary embodiment;

FIG. 4 is a schematic cross-sectional diagram of an alternative embodiment of PET device of FIG. 2, in which the first and second PE material layers have separate pairs of electrodes, separated by an insulator layer;

FIG. 5 is a schematic cross-sectional diagram of an alternative embodiment of the PET device of FIG. 4, in which the PR material layer is disposed between the first and second PE material layers;

FIG. 7 is a table that compares various parameters of the PET devices of FIGS. 2-6, with respect to the single PE material layer PET device of FIG. 1;

FIG. 9 is a truth table for the AND gate of FIG. 8;

FIG. 11 is a truth table for the NAND gate of FIG. 10.

DETAILED DESCRIPTION

Figure 6:
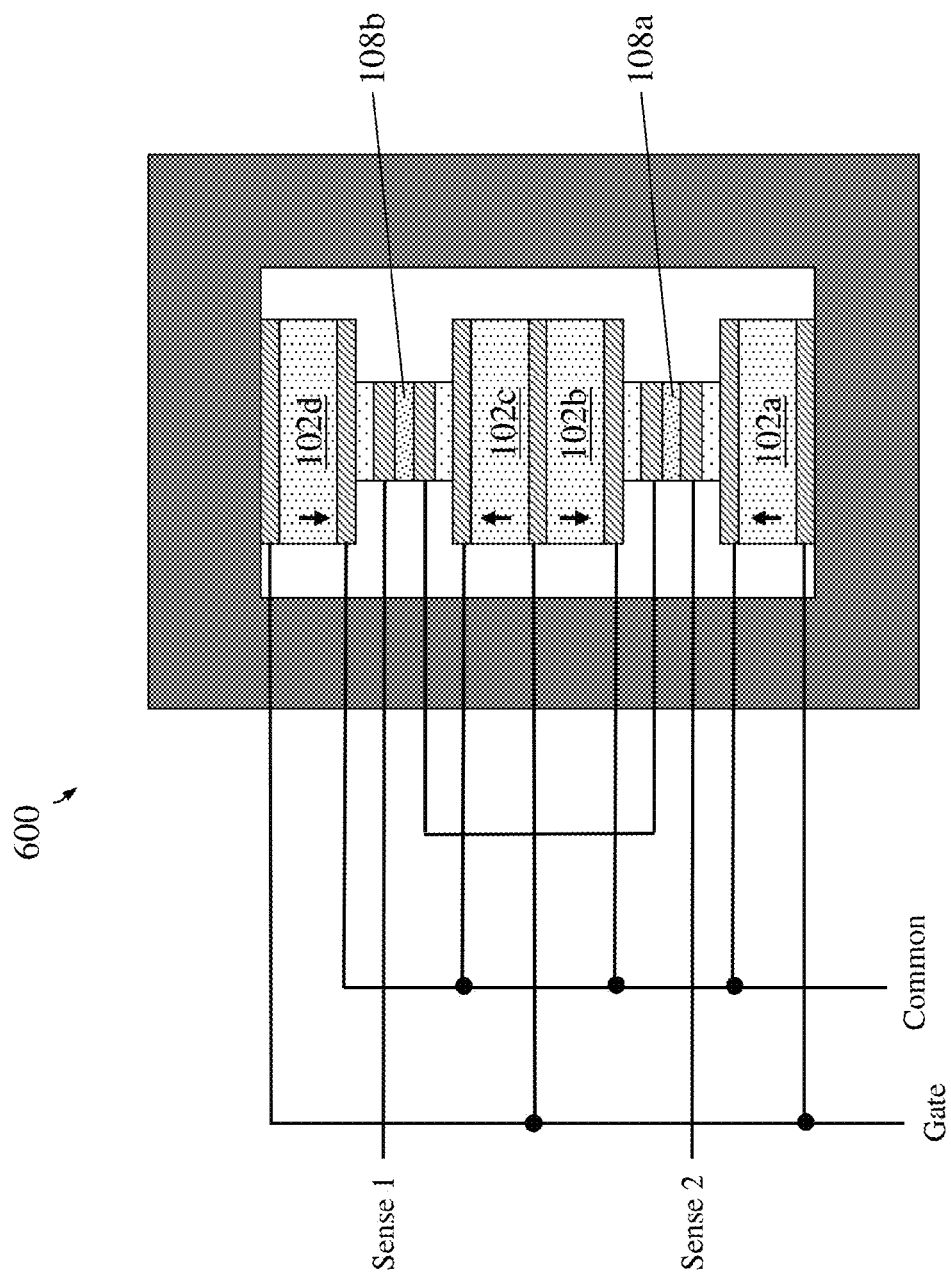
FIG. 6 is a schematic cross-sectional diagram of a 4-terminal PET device having first, second, third and fourth PE material layers coupled to first and second PR material layers, in which the first through fourth PE material layers have thicknesses about one quarter of that of the PE layer of FIGS. 1A-1C, and the first and second PR material layers have thicknesses about half of that of the PR material layer of FIGS. 1A-1C, in accordance with an exemplary embodiment.

Piezoelectronic switches and memory consist of a piezoelectric (PE) material in mechanical contact with a piezoresistive (PR) material that changes its resistivity upon compression and rarefaction. In operation, PE material expansion compresses the PR and causes it to change into a stable state with a low resistance. Conversely, PE contraction changes the PR into a stable state with a high resistance. Detailed discussions of piezoelectronics, including materials for the PE and PR, and simulations of piezoelectronic transistors (PETs), logic inverters, ring oscillators, and flip-flops, may be found in D. M. Newns, B. G. Elmegreen, X.-H. Liu, G. Martyna 2012, "A Low-Voltage High-Speed Electronic Switch Based on Piezoelectric Transduction," J. Appl. Phys., 111, 084509, and in D. M. Newns, B. G. Elmegreen, X.-H. Liu, G. Martyna 2012, "High Response Piezoelectric and Piezoresistive Materials for Fast, Low Voltage Switching: Simulation and Theory of Novel Transduction Physics at the Nanoscale" Advanced Materials, 24, p. 3672-3677. Further patent related disclosures for other aspects of the PET may be found in U.S. Pat. No. 8,159,854 to Elmegreen, et al., U.S. Pat. No. 8,247,947 to Elmegreen, et al., and U.S. patent application Ser. No. 13/176,880.

With respect the above mentioned application of PE and PR materials for use in transistor devices, the piezoelectronic transistor (PET) has been proposed as a low-voltage high-frequency switch in which an applied gate voltage expands a PE material transducer, generating high pressure in an adjacent PR material which then transforms from semiconducting to metallic electrical behavior. As discussed in further detail below, a single PE layer PET may be embodied as a 3-terminal device or, with the addition of a low-permittivity dielectric layer, as a 4-terminal device. In either instance, the PE and PR layers are embedded in a material with high Young's modulus (HYM) to resist deformation. Logic circuits analogous to conventional CMOS may be made from combinations of PETs as part of a new field referred to as piezoelectronics.

Referring initially to FIGS. 1A and 1B, there is shown a cross sectional view and a perspective view, respectively, of a 3-terminal PET 100. As is shown, the 3-terminal PET 100 includes a PE material layer 102 disposed between a gate electrode 104 and a common electrode 106, a PR material layer 108 disposed between the common electrode 106 and a sense electrode 110, and a semi-rigid high yield material (HYM) 112 serving as a housing that surrounds the materials and electrodes. Again, a PE material is a material that may either expand or contract when an electric potential is applied thereacross, while a PR material in the present context is a material that changes resistivity with applied mechanical stress so as to transition from an insulator to a conductor. A medium 114 between the HYM 112 and the various electrodes, PE and PR material layers may remain as a void, or be filled with a soft solid material or a gas (e.g., air). As particularly shown in the perspective view of FIG. 1B, the PE material layer 102 has a cross sectional area (A) along the x-y axes and a thickness (L) along the z-axis. The PR material layer 108 has a cross sectional area (a) along the x-y axes and a thickness (l) along the z-axis.

In operation, an input voltage coupled to the gate electrode 104 and the common electrode 106 is applied across the PE material layer 102 (the arrow in the figures representing the direction of the electric field when the voltage is applied), which causes an expansion and displacement of the crystal material of the PE material layer 102 that in turn acts on the PR material layer 108 via the HYM 112. That is, the induced pressure from the PE material layer 102 causes an insulator-to-metal transition so that the PR material layer 108 provides a conducting path between the common electrode 106 and the sense electrode 110. The HYM 112 ensures that the displacement of the PE material layer 102 is transmitted to the PR material layer 108 rather than the surrounding medium 114.

The PE material layer 102 can be made from a relaxor such as PMN-PT (lead magnesium niobate-lead titanate) or PZN-PT (lead zinc niobate-lead titanate) or other PE materials typically made from perovskite titanates. Such PE materials have a large value of displacement/V ($d_{33}$), e.g., $d_{33}$=2500 pm/V, support a relatively high piezoelectric strain (~1%), and have a relatively high endurance. The PE material layer 102 could also be made from PZT (lead zirconate titanate). The PR material layer 108 is formed from a material that undergoes an insulator-to-metal transition under increasing pressure in a range such as 0.4-3.0 GPa. Examples of PR materials include samarium selenide (SmSe), thulium telluride (TmTe), nickel disulfide/diselenide ($Ni(S_xSe_{1-x})_2$), vanadium oxide ($V_2O_3$) doped with a small percentage of Cr, and calcium ruthenium oxide ($Ca_2RuO_4$). The insulator layer(s) can have a relatively high Young's modulus, for example, 60 gigapascals (GPa) to 250 GPa, a relatively low dielectric constant (e.g., about 4-12), and a high breakdown field. Suitable insulator materials include, for example, silicon dioxide ($SiO_2$) or silicon nitride ($Si_xN_y$).

The electrode materials may be made from strontium ruthenium oxide ($SrRuO_3$ (SRO)), platinum (Pt), tungsten (W) or other hard conducting materials.

An alternative to the 3-terminal PET design of FIGS. 1A and 1B is illustrated in FIG. 1C, which depicts a schematic cross-sectional diagram of a 4-terminal PET 150. For ease of description, like materials are denoted with similar reference numerals. As is the case for the 3-terminal PET 100, the 4-terminal PET 150 in FIG. 1C also includes a single PE material layer 102. Here, however, instead of being disposed between a gate electrode and a common electrode, the PE material layer 102 is disposed between a first gate electrode 152 and a second gate electrode 154. A low permittivity insulator layer 156 separates the second gate electrode 154 from a first sense electrode 158. Effectively, the common electrode of the 3-terminal configuration is split into the second gate electrode 154 and the first sense electrode 158 for a 4-terminal configuration. The PR material layer 108 is between the first sense electrode 158 and a second sense electrode 160.

The insulator layer 156 separating the second gate electrode 154 and first sense electrode 158 may have a relatively high Young's modulus, such as in the range of about 60 gigapascals (GPa) to about 250 GPa, for example, a relatively low dielectric constant (e.g., about 4-12), and a high breakdown field. Suitable insulator materials thus include, for example, silicon dioxide ($SiO_2$) or silicon nitride ($Si_3N_4$). Similar to the 3-terminal PET configuration 100, the 4-terminal PET 150 includes a high yield strength material 112 such as silicon dioxide ($SiO_2$) or silicon nitride ($Si_3N_4$) which surrounds and encapsulates all of the components described above. Again, there is a gap or vacant space 114 between the various layers of the 4-terminal PET 150 and the high yield material 112, which increases the freedom of mechanical displacement of the layers. The electrodes in the 4-terminal PET 150 may include materials such as strontium ruthenium oxide (SrRuO$_3$ (SRO)), platinum (Pt), tungsten (W) or other suitable mechanically hard conducting materials.

In operation of the 4-terminal PET 150, an input voltage between the first gate electrode 152 and the second gate electrode 154 may be always positive or zero. When the input voltage is zero, the PE material layer 102 has no displacement and the PR material layer 108 is uncompressed, giving it a high electrical resistance such that the 4-terminal PET 150 is "off". When a significant positive voltage is applied between the first gate electrode 152 and the second gate electrode 154, the PE material layer 102 develops a positive strain. That is, the PE material layer 102 expands upwards along the axis perpendicular to the stack. The upward expansion of the PE material layer 102 tries to compress the high Young's modulus insulator 156, but the main effect is to compress the more compressible PR material layer 108. The compressive action is effective because the surrounding high yield strength material 112 strongly constrains the relative motion of the top of the second sense electrode 160 and the bottom of the first gate electrode 152. The combined effect of the mechanical compression of the PR material layer 108 by the constrained stack and the PR material layer 108 piezoresistive response is to lower the first sense electrode 158 to the second sense electrode 160 impedance by about 3-5 orders of magnitude under conditions where the input voltage is the designed line voltage VDD. The 4-terminal PET switch 150 is now "on".

Piezoelectronics, such as illustrated in the examples of FIGS. 1A-1C, may be designed to follow the Dennard scaling scenario, i.e., the power density is independent of lithographic length scale. The motivation for developing the PET is that Dennard scaling has now ceased for conventional CMOS. As a result, CMOS clock speed (which is limited by power density) has not increased since 2003, whereas piezoelectronics promises to break this barrier. Because the voltage to switch the PET is only about 10%-20% of the voltage for a field effect transistor (FET), the power required by piezoelectronics is only a few percent of that for CMOS at the same clock frequency. A functional low power switch, such as the PET is predicted to be, would have broad implications for speed and power requirements in systems ranging from portable electronics to supercomputers.

The intrinsic speed of a PET device is determined by a combination of the sound crossing time through the PE and the RC time of the circuit. The sound crossing time enters because of the finite speed of propagation of the expansion of the PE, which regulates the resistance through the PR. The RC time of the circuit may include other PET's and devices with various fan-outs and fan-ins. Designs that minimize sonic oscillations and their associated resistance oscillations have critical damping which, for purely resistive damping, means that the RC time associated with each PET circuit is comparable to the sonic time in that PET. Longer RC times slow down the expansion of the PE because the surface charge which drives the expansion takes a long time to build up. On the other hand, shorter times can lead to excessive oscillations in the PE and to unwanted resonances and harmonics with other PETs in the circuit.

A design constraint concerns the voltage between the drive and the common across the PE. This is determined by the expansion distance of the PE that is required to compress the PR sufficiently to decrease its resistance to an operable range during the ON state of the PET. Materials with higher piezoelectric constants allow lower voltages for a given displacement and PR compression. However, there is a lower limit on the required voltage that depends on the availability of suitable PE materials and on the PET design. One important aspect of this PET design is the area ratio between the PE and the PR, which determines the stress multiplier. Higher area ratios allow lower applied voltages to give the same PR compression, but higher areas also have higher PE capacitance, which increases the RC time.

It is therefore desirable to find alternative designs, which, for geometric reasons, lower the required voltage or increase the operating frequency, or both, without changing the material properties of the PE and PR. The present invention gives such designs. A key aspect is the ability in fabrication to stack the component layers.

As described in further detail herein, stacked PE and PR materials also allow more complex PET designs with minimal surface area. For example, it would be desirable to reduce the number of devices in the NAND gate, which are four in CMOS. Embodiments herein describe, for example, a NAND gate formed from a pair of (2) PET devices, each of which has a multilayer stack structure. Additional embodiments for piezoelectronics are described herein, in which devices contain multiple layers of PE and PR materials separated by metallic or insulator layers. Proper stacking for a PET allows combinations of desirable attributes such as, for example lower voltage, lower power, higher frequency, higher density and/or greater flexibility.

For purposes of comparison, a "standard" or "reference" PET such as that described above in FIGS. 1A-1C refers to a PET having just a single PE material layer of thickness L and area A, and a PR material layer disposed at one end of the PE of thickness l and area a. Comparisons between the embodiments described below and the reference design are made with respect to voltage, capacitance, power and frequency. Two positions for the PR material are considered relative to the PE material, and various thicknesses for the PE and PR materials are considered as examples of possible modifications to the reference design. Additional designs with more layers, other relative positions, other PE thicknesses, and with various changes to the PR dimensions are understood to be modifications that are contemplated to be within the scope of the present embodiments.

Referring now to FIG. 2, there is shown a cross-sectional diagram of a 3-terminal PET device 200 having first and second PE material layers 102a, 102b stacked adjacent to one another, and coupled to a PR material layer 108, in which the first and second PE material layers 102a, 102b have thicknesses about half that (i.e., L/2) of the PE layer 102 of FIGS. 1A-1C. As can be seen from FIG. 2, the PR material layer 108 is at one end of the PE stack and has the same dimensions as in the reference design. The voltage required for a given PR compression is about half of the reference value, $V_0/2$, but now the capacitance is four times the reference, $4C_0$, because the contact area is twice as large and the capacitor thickness is half the reference.

The energy to compress the PR material layer 108 is the sum of a Coulomb energy in the capacitor, $0.5\,CV^2$, plus the compressional energies in both the PR material layer 108 and PE material layers 102a, 102b. For a fixed pressure in the PR material layer 108, and fixed overall dimensions, the compressional energies are about the same in FIG. 2 as in the reference design. The Coulomb energy is also about the same. Thus, the electrical energy to generate the same pressure is about the same with respect to the reference design.

By way of a further comparison, the sonic time in the PET design of FIG. 2 equals the reference time, $T_0$, because a rarefaction wave has to travel over the same distance L before stress equilibrium in both PEs is reached. Critical damping therefore requires a PR resistance equal to ¼ of the reference value to offset the 4× increased capacitance in the PE at the same RC time. The power used is equal to the energy divided by the time, which is therefore also about the same. This design is therefore useful for low voltage devices with reference power and speed. Low voltage with reference PET power should imply lower power overall in the circuit for a given wiring capacitance, because the power lost to the wiring scales as the square of the voltage.

FIG. 3 is a schematic cross-sectional diagram of a 3-terminal PET device 300 having first, second, third and fourth PE material layers 102a, 102b, 102c, 102d, coupled to a PR material layer 108, in which the first through fourth PE material layers 102a, 102b, 102c, 102d have thicknesses about one quarter of that (i.e., L/4) of the PE material layer 102 of FIGS. 1A-1C.

In a design such as the PET 300 of FIG. 3, the operating voltage can decrease to arbitrarily low values, $V_0/N$, at constant switching frequency, with the voltage in inverse proportion to the number, N, of PEs in the stack if each PE layer thickness decreases inversely with N, as L/N, and the PR resistance decreases like $R_0/N^2$ to maintain a constant RC time. The frequency would be invariant in this case, as in FIG. 2, because the distance between the PR surface of the PE and the HYM is still L. This scaling assumes that the pressure and inertial delays in the thin metal conducting layers are negligible; realistic delays in these layers would slow the device somewhat compared to this simple model. Actual PET timing depends on the density, thickness, and Young's modulus in the metal layers. PET timing also depends on other materials properties in addition to the properties of the PE and PR, such as the stiffness of the surrounding high Young's modulus material, and it depends on the resistance and capacitance in the wiring of the circuit, and the resistance and capacitance of the contact surfaces between the different materials. The lower limit to the voltage is set by the lower limit to the resistance, which requires a minimum off resistance to avoid excessive leakage during operation.

FIG. 4 is a schematic cross-sectional diagram of an alternative embodiment of the PET device of FIG. 2. Here, the PET device 400 has an additional gate terminal and an insulator layer 402 that separates the gate electrode such that the poling of each PE material layer 102a, 102b is in the same direction. It should be noted that insulator layers may also similarly be used in the design of FIG. 3 such that all four PE material layers 102a, 102b, 102c, 102d are polled in the same direction.

Referring now to FIG. 5, there is shown a schematic cross-sectional diagram of an alternative embodiment of the PET device of FIG. 4, in which the PR material layer 108 is disposed between the first and second PE material layers 102a, 102b. For the PET 500 of FIG. 5, the voltage required for a given PR compression is now about half of the reference value, $V_0/2$, the capacitance is four times the reference, $4C_0$, and the energy to compress the PR material layer 108 is about the same as the reference energy, as is the case for the FIG. 2 embodiment. However, the sonic time is now half the reference value, $T_0/2$, because the rarefaction wave only has to travel over the distance L/2 before stress equilibrium in both PEs is reached. For critical damping, the power used is therefore twice the reference power, and the resistance in the PR material layer 108 should be about ⅛ the normal value, so that the RC time is half the reference value, like the sonic time. Accordingly, this design is useful for low-voltage, high-speed devices. An alternate design with the common and gate terminals inverted in one of the PEs would result in having the same poling directions for the PE material layers 102a, 102b.

FIG. 6 is a schematic cross-sectional diagram of a 4-terminal, PET device 600 having first, second, third and fourth PE material layers 102a, 102b, 102c, 102d coupled to first and second PR material layers 108a, 108b, in which the first through fourth PE material layers 102a, 102b, 102c, 102d have thicknesses about one quarter of that of the PE layer 102 of FIGS. 1A-1C, and the first and second PR material layers 108a, 108b have thicknesses about half of that of the PR material layer 108 of FIGS. 1A-1C. More specifically, the PET device 600 has a PR material layer between each pair of PE material layers. Further extrapolating the principles of this embodiment, for N stacked PE material layers each having a thickness of L/N, there would also be N/2 PR material layers each having a thickness of 2(l/N).

The PR material layers 108a, 108b are connected in series such that the total resistance is the same as in the reference case. For this design (shown with N=4 in FIG. 6), the voltage required to compress the PR material layer to the reference pressure is about $V_0/N$, and the sonic time is about ½N times the reference value, $T_0/2N$. The capacitance is $N^2 C_0$, which means the resistivity in the PR material layer has to be less than reference as $R_0/N^3$ so the RC time scales with the sonic time. This design is useful for low voltage and high speed operation.

FIG. 7 is a table that compares various parameters of the exemplary multiple PE layer PET devices of FIGS. 2-6, with respect to the single PE layer PET device of FIG. 1. A key element of the multiple PE layer designs in FIGS. 2-6 is the control of the piezoelectric expansion coefficient, $d_{33}$, which can decrease as the PE layers become thin due to clamping to the electrodes. To overcome this, an (N−1) by (N−1) array of V-shaped trenches having depth 0.5 L/N may be added to each PE layer, which has the effect of keeping the operational width-to-thickness aspect ratio, $W_{PE}/L_{PE}$, constant. The ability to fabricate the cracks limits the number of layers N the device can support.

Figure 8:
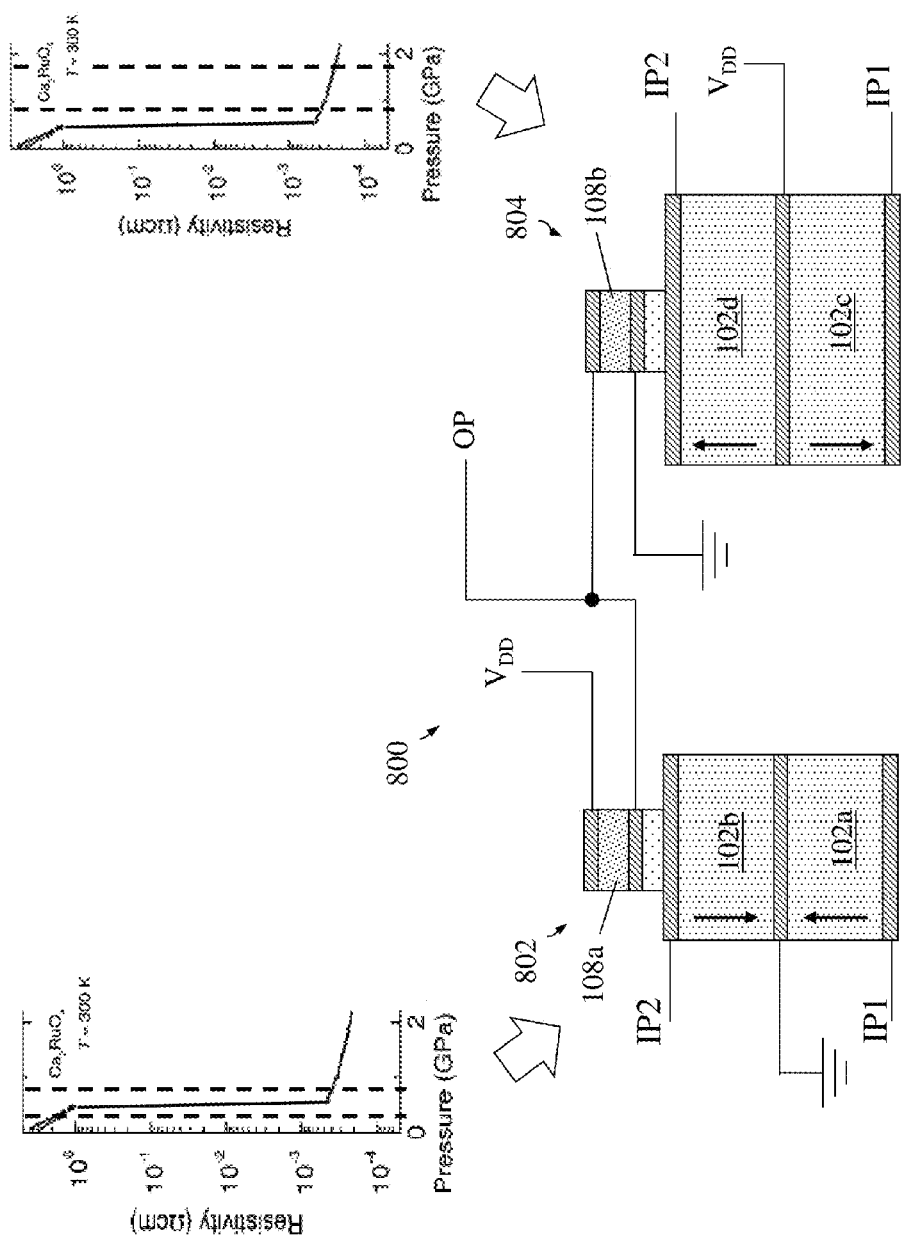
FIG. 8 is a schematic diagram of an AND gate using a pair of 2-PE layer PET devices, in accordance with another embodiment.

Referring now to FIG. 8, there is shown a schematic diagram of a logical AND gate 800 that may be formed using a pair of 2-PE layer PET devices in accordance with another embodiment. As is shown, the AND gate 800 includes a first PET device 802 interconnected with a second PET device 804 to form an AND gate with a low area footprint. The first PET device 802 is configured so as to have a smaller cross sectional area for the PE material layers 102a, 102b, than with respect to the PE material layers 102c, 102d for the second PET device 804, so a given voltage drop across the PE material layers 102a, 102b, 102c, 102d creates a smaller pressure in the PR material layer 108a of the first PET device 802 than in the PR material layer 108b of the second PET device 804.

For both the first PET device 802 and the second PET device 804, a corresponding resistivity versus pressure graph for $Ca_2RuO_4$ is shown above the respective devices in FIG. 8. The leftmost vertical dashed line in each graph indicates the resulting pressure applied to the PR material layer for a voltage applied across either of (but not both) the PE material layers for that PET device. The rightmost vertical dashed line in each graph indicates the resulting pressure applied to the PR material layer when a voltage is applied across both the PE material layers for that device. As will be noted from the resistivity curves, the first PET device 802 is in a low resistance state for the PR material layer 108a only when both PE material layers 102a, 102b are charged, whereas the second PET device 804 is in a low resistance state for the PR material layer 108b whenever either PE material layer 102c or PE material layer 102d is charged, or both. Thus, the first PE device 802 has the characteristics of an "and-like" operation, in that both PE material layers 102a, 102b have to be charged in order to decrease the resistance of the PR material layer 108a; if either PE material layer 102a or PE material layer 102b is uncharged, or if neither is charged, then the resistance of the PR material layer 108a is high. In contrast, the second PE device 804 has the characteristics of an "or-like" operation: if either PE material layer 102c or PE material layer 102d is charged, or if both are charged, then the resistance of the PR material layer 108b is low, but if neither is charged, then the resistance of the PR material layer 108b is high.

The combination of these two logical operations may therefore result in an AND gate with the wiring shown for the PR material layers 108a, 108b. Specifically, the output terminal "OP" is high with a voltage equal to $V_{DD}$ only when both inputs 1 and 2 are high, thereby defining an AND gate. A complete truth table for the AND gate 800 of FIG. 8 is illustrated in FIG. 9. As described in the truth table 900, the designation "E" refers to a PE material layer being expanded, and the designation "-" refers to a PE material layer not being expanded. The designation "Hi" refers to a PR material layer being in the high resistance state, and the designation "Lo" refers to a PR material layer being in the low resistance state.

By way of example, when both IP1 and IP2 are low (logical "0"), neither PE material layer 102a nor PE material layer 102b are expanded, since the electrode therebetween is connected to ground and no voltage is applied across these layers. The PR material layer 108a is thus in a high resistance state. On the other hand, IP1 and IP2 both being low causes both PE material layer 102c and PE material layer 102d to be expanded, since the electrode therebetween is connected to $V_{DD}$ and thus $V_{DD}$ is applied across these layers. The PR material layer 108b is therefore in a low resistance state. Because the PR material layer 108a and the PR material layer 108b are connected in series between $V_{DD}$ and ground, and the output terminal OP is connected between PR material layer 108a and PR material layer 108b, the high resistance of PR material layer 108a isolates OP from $V_{DD}$, while the low resistance of PR material layer 108b couples OP to ground. It will be noted that the AND gate 800 is connected such that PR material layer 108a and PR material layer 108b are always in an opposite resistance state with respect to one another so as to allow OP to go to either $V_{DD}$ or ground, and to prevent a short circuit.

As further shown in the truth table 900, when IP1 and IP2 are opposite, only one of PE material layer 102a or PE material layer 102b are expanded, and so the PR material layer 108a remains in a high resistance state. Conversely, opposite logic values of IP1 and IP2 result in one of PE material layer 102c or PE material layer 102d being expanded, in turn resulting in PR material layer 108b being in a low resistance state. Therefore, OP is low (ground). However, when both IP1 and IP2 are high (logical "1"), both PE material layer 102a and PE material layer 102b are expanded, which then drives PR material layer 108a to a low resistance state. Conversely, when both IP1 and IP2 are high, neither PE material layer 102c nor PE material layer 102d are expanded, in turn resulting in PR material layer 108b being in a high resistance state. In this instance, OP is high (i.e., coupled to $V_{DD}$ via the low resistance PR material layer 108a).

Figure 10:
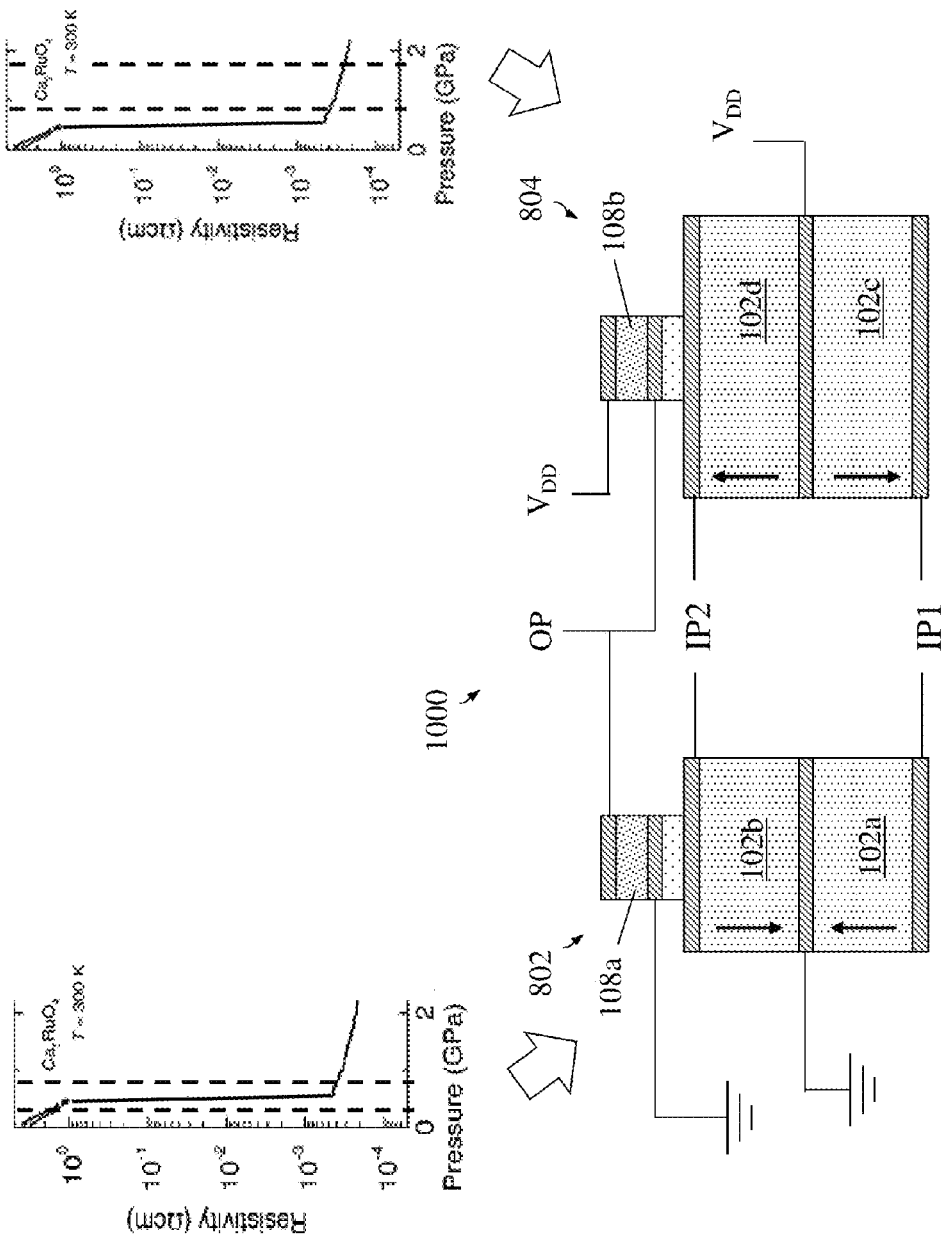
FIG. 10 is a schematic diagram of a NAND gate using a pair of 2-PE layer PET devices, in accordance with another embodiment.

By reconfiguring the wiring of the AND gate 800, a NAND gate function may also be achieved using the same a pair of 2-PE layer PET devices 802, 804. In this regard, FIG. 10 is a schematic diagram of a NAND gate 1000 using a pair of 2-PE layer PET devices 802, 804, in accordance with another embodiment. Here, the wiring across the PR material layers 108a, 108b is reversed with respect to the AND gate embodiment of FIG. 8 such that the PR material layer 108b is connected between $V_{DD}$ and OP while the PR material layer 108a is connected between OP and ground. As one skilled in the art is equally familiar with the logical operation of a NAND gate, the specific details of operation of the device 1000 are not repeated in detail herein. However, FIG. 11 illustrates a truth table 1100 for the NAND gate 1000 of FIG. 10. It should be readily apparent from the above description that other logic operations using stacked PET technology are also contemplated, which may result in decreasing the density of PET logic on a chip, and with increased or similar performance to that in the previous designs.

As will thus be appreciated, the fabrication of PE and PR materials in stacks with intervening layers of conductive or non-conductive materials allows for greater diversity in PET operations and applications, as compared to single-PE and single-PR stacks. In particular, low-voltage, low-power, and or high frequency designs are possible with optimal numbers and thicknesses of the PEs in a stack. Stacking also allows for complex logic devices to be designed with small cross sectional areas for greater density on a chip.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A piezoelectronic logic device, comprising:
a first piezoelectric transistor (PET) device and a second PET device, the first PET device and the second PET device each having a first PE material layer, a second PE material layer, and a piezoresistive (PR) material layer arranged in a stacked configuration, wherein
the first PE material layer and the second PE material layer of the first PET device have a smaller cross sectional area than the first PE material layer and the second PE material layer of the second PET device,
for each of the first PET device and the second PET device, the first PE material layer is disposed between a first electrode and a second electrode, the second PE material layer is disposed between the second electrode and a third electrode, and the PR material layer is disposed between a fourth electrode and a fifth electrode, and the third electrode and the fourth electrode are separated by an insulating layer,
an output terminal is connected between the PR material layer of the first PET device and the PR material layer of the second PET device, the piezoelectronic logic device is an AND gate based on a line voltage being applied to the fifth electrode of the first PET device and the output terminal being connected to both the fourth electrode of the first PET device and the fifth electrode of the second PET device, and the piezoelectronic logic device is a NAND gate based on the line voltage being applied to the fifth electrode of the second PET device and the output terminal being connected to both the fifth electrode of the first PET device and the fourth electrode of the second PET device.

\* \* \* \* \*